United States Patent
Shimizu et al.

(10) Patent No.: US 9,218,859 B2
(45) Date of Patent: Dec. 22, 2015

(54) SEMICONDUCTOR MEMORY DEVICE

(71) Applicant: Kabushiki Kaisha Toshiba, Minato-ku (JP)

(72) Inventors: Yuui Shimizu, Kawasaki (JP); Yasuhiro Suematsu, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 197 days.

(21) Appl. No.: 14/019,811

(22) Filed: Sep. 6, 2013

(65) Prior Publication Data

US 2014/0286110 A1   Sep. 25, 2014

Related U.S. Application Data

(60) Provisional application No. 61/803,516, filed on Mar. 20, 2013.

(30) Foreign Application Priority Data

Aug. 21, 2013   (JP) .................................. 2013-171100

(51) Int. Cl.
*G11C 7/00* (2006.01)
*G11C 7/02* (2006.01)
*G11C 7/10* (2006.01)

(52) U.S. Cl.
CPC ............... *G11C 7/02* (2013.01); *G11C 7/1048* (2013.01); *G11C 7/1057* (2013.01); *G11C 7/1084* (2013.01); *G11C 2207/105* (2013.01); *G11C 2207/108* (2013.01)

(58) Field of Classification Search
CPC ...... G11C 7/02; G11C 7/1048; G11C 7/1057; G11C 7/1084

USPC ............. 365/185.18, 185.05, 185.23, 230.06, 365/230.08, 189.011

See application file for complete search history.

(56) References Cited

U.S. PATENT DOCUMENTS

| | | | |
|---|---|---|---|
| 7,161,378 B2 | 1/2007 | Kang et al. | |
| 2006/0091901 A1* | 5/2006 | Kim | 326/30 |
| 2009/0201046 A1* | 8/2009 | Pan et al. | 326/29 |
| 2012/0134439 A1 | 5/2012 | Sato et al. | |
| 2013/0099818 A1* | 4/2013 | Grunzke | 326/30 |
| 2013/0242664 A1* | 9/2013 | Shimizu et al. | 365/185.18 |

FOREIGN PATENT DOCUMENTS

| | | |
|---|---|---|
| JP | 2-174316 | 7/1990 |
| JP | 3-143015 | 6/1991 |
| JP | 2006-129423 | 5/2006 |
| JP | 2012-119849 | 6/2012 |

* cited by examiner

*Primary Examiner* — Toan Le
(74) *Attorney, Agent, or Firm* — Oblon, McClelland, Maier & Neustadt, L.L.P.

(57) ABSTRACT

A semiconductor memory device comprises: a plurality of on-die termination circuits connected to each of a plurality of input/output pads; and a control circuit for controlling the on-die termination circuit. The on-die termination circuit comprises: a pull-up element connected between a first terminal and an output terminal; and a pull-down element connected between the output terminal and a second terminal. The pull-up element is driven by a first pull-up element driver, and the pull-down element is driven by a first pull-down element driver. The control circuit activates a plurality of the on-die termination circuits at different timings.

16 Claims, 16 Drawing Sheets

FIG. 13B

During OCD/ODT Combined Use

| | | | | | | |
|---|---|---|---|---|---|---|
| OCD/ODT(300) | × | | | | × | × |
| OCD/ODT(150) | × | | | × | × | × |
| OCD/ODT(200) | | × | | × | × | × |
| OCD/ODT(200)' | | × | × | × | × | × |
| ODT(116.7) | | | × | × | × | × |
| ODT(87.5) | | | | | × | × |
| ODT(64.3) | | | | | | × |
| Termination Resistance (Ω) | 100 | 100 | 50 | 35 | 25 | 18 |

OCD/ODT Combined Use: rows OCD/ODT(300), OCD/ODT(150), OCD/ODT(200), OCD/ODT(200)'
OCD Exclusive Use: rows ODT(116.7), ODT(87.5), ODT(64.3)

FIG. 14B

| During OCD/ODT Non-Combined Use | | | | | | |
|---|---|---|---|---|---|---|
| ODT(300) | × | | | | | |
| ODT(150) | × | | | | | |
| ODT(200) | | × | | | | |
| ODT(200)' | | × | | | | |
| OCD(50) | | | | × | | |
| OCD(116.7) | | | | × | × | |
| OCD(87.5) | | | | | × | × |
| OCD(64.3) | | | | | × | × |
| Termination Resistance (Ω) | 100 | 100 | 50 | 35 | 25 | 18 |

SEMICONDUCTOR MEMORY DEVICE

CROSS REFERENCE TO RELATED APPLICATIONS

This application is based on and claims the benefit of priority from prior Provisional U.S. Patent Application No. 61/803,516, filed on Mar. 20, 2013, and Japanese Patent Application No. 2013-171100, filed on Aug. 21, 2013, the entire contents of which are incorporated herein by reference.

FIELD

Embodiments described in the present specification relate to a semiconductor memory device.

BACKGROUND

In recent years, it has become required to speed up an interface for exchanging data with a controller chip in a semiconductor chip such as a NAND type flash memory. An on-die termination circuit is sometimes employed in an input/output buffer for a purpose of speeding-up of the interface. This on-die termination circuit is a circuit that functions to optimize a waveform of an input signal, thereby contributing to speeding-up of the interface. However, since the on-die termination circuit passes a penetration current, there is a risk that when several on-die termination circuits are activated simultaneously, a fall in level of a power supply voltage, an increase in peak current, and so on, will be encouraged.

BRIEF DESCRIPTION OF THE DRAWINGS

FIG. 13B is a correspondence table showing a relationship between a combination of circuits simultaneously selected in FIG. 13A and a value of a termination resistance obtained.

FIG. 14B is a correspondence table showing a relationship between a combination of circuits simultaneously selected in FIG. 14A and a value of a termination resistance obtained.

DETAILED DESCRIPTION

A semiconductor memory device in an embodiment described below comprises: a memory device configured having memory cells arranged therein; a data output buffer for outputting data read from the memory device, and a data input buffer for receiving data to be written to the memory device; a plurality of input/output pads to which the data input buffer and the data output buffer for inputting/outputting the data are respectively connected; a plurality of on-die termination circuits each connected between any one of the plurality of input/output pads and any one of the data input/output buffers; and a control circuit for controlling the on-die termination circuit. The on-die termination circuit comprises: a pull-up element connected between a first terminal and an output terminal; and a pull-down element connected between the output terminal and a second terminal. The pull-up element is driven by a first pull-up element driver, and the pull-down element is driven by a first pull-down element driver. The control circuit activates a plurality of the on-die termination circuits at different timings.

Next, a nonvolatile semiconductor memory device according to an embodiment will be described with reference to the drawings.

[First Embodiment]

Figure 1:
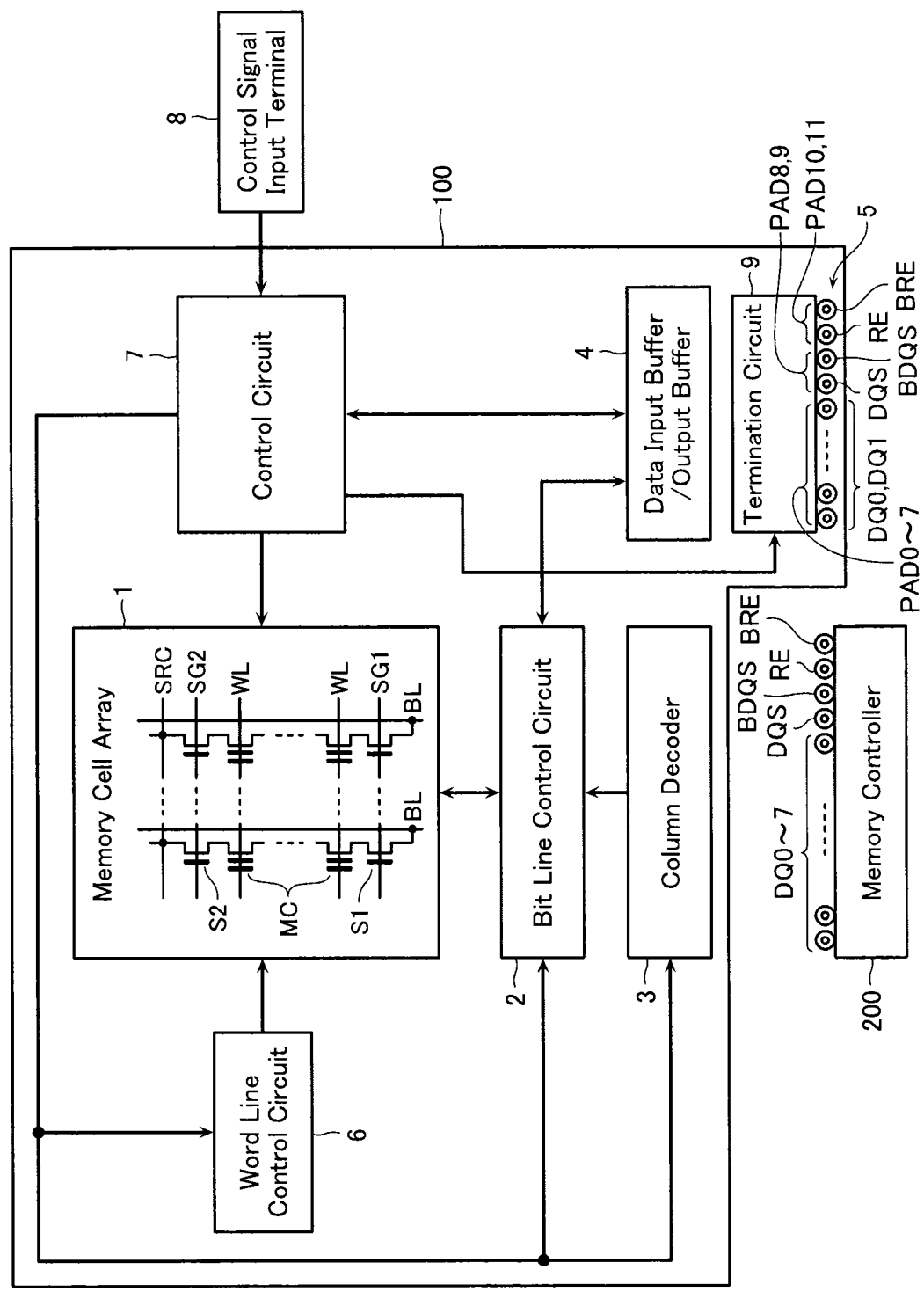
FIG. 1 is a block diagram showing a configuration of a nonvolatile semiconductor memory device according to a first embodiment.

FIG. 1 is a block diagram showing a configuration of a nonvolatile semiconductor memory device according to a first embodiment. In this first embodiment, description proceeds assuming the nonvolatile semiconductor memory device to be a NAND type flash memory as an example. However, the embodiments described below can be applied to various forms of memory devices besides a NAND type flash memory.

The nonvolatile semiconductor memory device of this first embodiment comprises a memory chip 100 including memory cells, and a memory controller 200 for controlling this memory chip 100. The memory chip 100 comprises a memory cell array 1 having data-storing memory cells MC disposed in a matrix therein. The memory cell array 1 includes a plurality of bit lines BL, a plurality of word lines WL, a source line SRC, and a plurality of the memory cells MC. The memory cells MC are configured electrically data rewritable and are disposed in a matrix at intersections of the bit lines BL and the word lines WL.

Connected to the memory cell array 1 are a bit line control circuit 2 for controlling a voltage of the bit line BL, and a word line control circuit 6 for controlling a voltage of the word line WL. The bit line control circuit 2 reads data of the memory cell MC in the memory cell array 1 via the bit line BL. In addition, the bit line control circuit 2 performs write to the memory cell MC in the memory cell array 1 via the bit line BL.

Connected to the bit line control circuit 2 are a column decoder 3, a data input buffer/output buffer 4, and a data input/output pad 5. The data input buffer/output buffer 4 functions to output data read via the bit line control circuit 2 from the memory cell array 1 and receive data to be written to the memory cell array 1. The data input/output pad 5 is connected respectively to the data input buffer and the data output buffer via a termination circuit 9 to be described later. The data input/output pad 5 includes, as an example, eight pads PAD0~PAD7 for inputting/outputting eight bits of data DQ0~DQ7, pads PAD8 and PAD9 for inputting/outputting strobe signals DQS and BDQS, and pads PAD10 and PAD11 for inputting/outputting clock signals RE and BRE.

Data of the memory cell MC read from the memory cell array 1 is outputted to external from the data input/output pad 5. Moreover, write data inputted to the data input/output pad 5 from external is inputted to the bit line control circuit 2 by the column decoder 3 to execute write to a designated memory cell MC.

In addition, the bit line control circuit 2, the column decoder 3, the data input buffer/output buffer 4, and the word line control circuit 6 are connected to a control circuit 7. The control circuit 7 generates a control signal for controlling the bit line control circuit 2, the column decoder 3, the data input buffer/output buffer 4, and the word line control circuit 6, based on a control signal inputted to a control signal input terminal 8. Note that the control circuit 7 may comprise the likes of a counter for counting the number of times of executions of a write operation and the number of times of executions of an erase operation, or a timer for timing a cumulative time of an operation.

Moreover, connected between the data input/output pad 5 and the data input buffer/output buffer 4 is a termination circuit 9. This termination circuit 9 is provided for achieving impedance matching between an output resistance of the memory controller 200 and an input resistance of the memory chip 100, and thereby suppressing reflection of signals.

Figure 2:
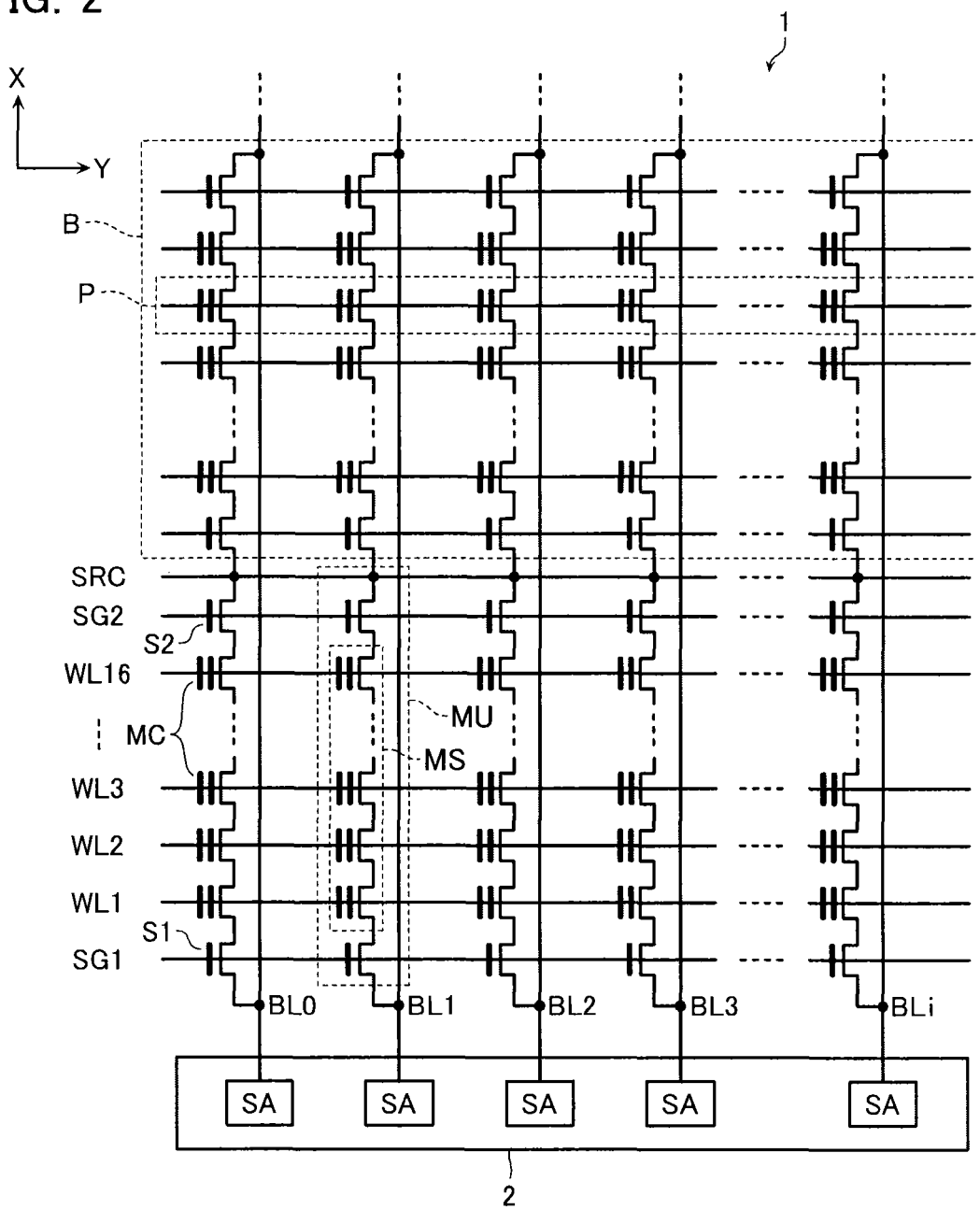
FIG. 2 is a circuit diagram showing a configuration of a memory cell array 1 shown in FIG. 1.

FIG. 2 is a circuit diagram showing a configuration of the memory cell array 1 shown in FIG. 1. As shown in FIG. 2, the memory cell array 1 is configured by a plurality of blocks B. In the memory cell array 1, data is erased in a unit of this block B (block erase processing).

As shown in FIG. 2, the block B is configured including a plurality of memory units MU. One memory unit MU is configured by: a memory string MS comprising for example 16 of the memory cells MC connected in series; and first and second select transistors S1 and S2 connected to both ends of the memory string MS. One end of the first select transistor S1 is connected to the bit line BL, and one end of the second select transistor S2 is connected to the source line SRC. Control gate electrodes of the memory cells MC disposed in a line in a Y direction are commonly connected to any one of word lines WL1~WL16. Moreover, control gate electrodes of the first select transistors S1 disposed in a line in the Y direction are commonly connected to a select line SG1, and control gate electrodes of the second select transistors S2 disposed in a line in the Y direction are commonly connected to a select line SG2. In addition, a group P of the plurality of memory cells MC connected to one word line WL configures one page or multiple pages. Data is written and read on the basis of this group P.

Figure 3:
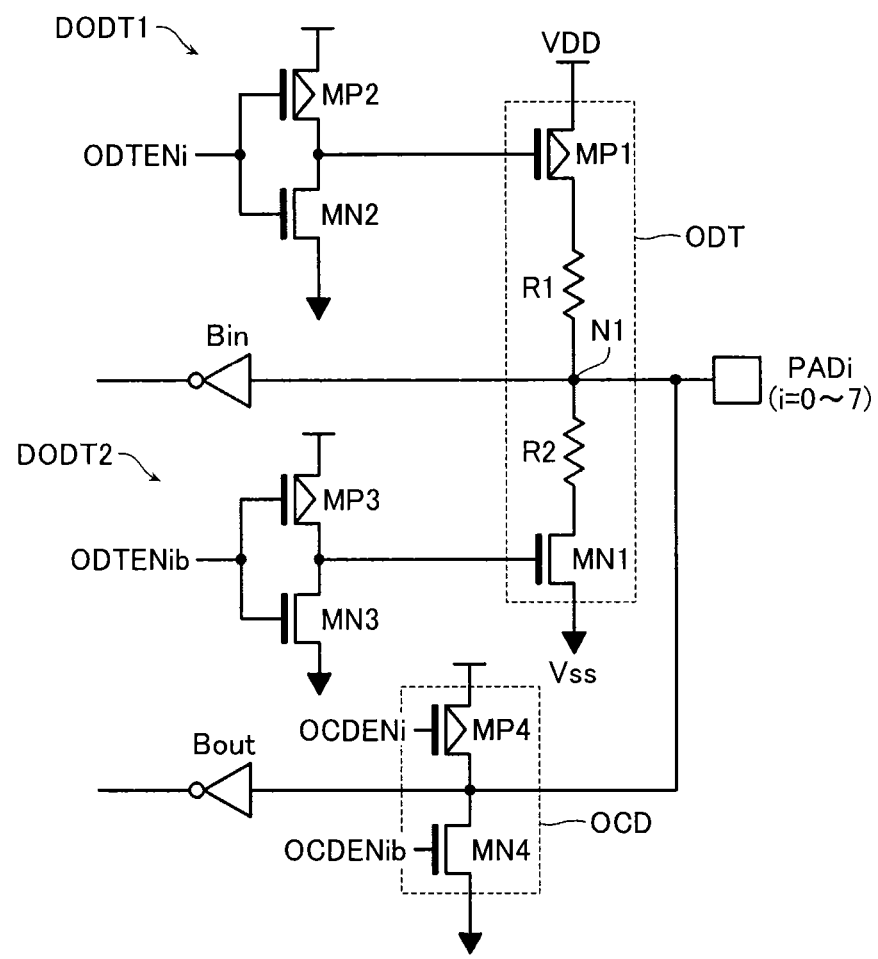
FIG. 3 explains a specific example of configuration of a termination circuit 9.

Next, a specific example of configuration of the termination circuit 9 will be described with reference to FIG. 3. The termination circuit 9 of this embodiment is configured having an on-die termination circuit ODT such as shown in FIG. 3 connected to one input/output pad PADi.

The on-die termination circuit ODT is configured having connected in series between a power supply terminal (VDD) and a ground terminal (Vss), a pull-up-dedicated p type MOS transistor MP1 and a resistance R1 that act as a pull-up element, and a resistance R2 and a pull-down-dedicated n type MOS transistor MN1 that act as a pull-down element. The on-die termination circuit ODT is a circuit for performing matching of an input resistance and an output resistance when for example data is inputted to the memory chip 100 from the memory controller 200. The pad PADi is connected to a connection node Nl of the resistances R1 and R2. Moreover, an inverter IN1 acting as a driver is also connected to the connection node Nl.

An output terminal of a driver DODT1 is connected to a gate of the p type MOS transistor MP1, and an output terminal of a driver DODT2 is connected to a gate of the n type MOS transistor MN1. The driver DODT1 is a CMOS inverter configured from a p type MOS transistor MP2 and an n type MOS transistor MN2, and has its input terminal supplied with an activating signal ODTENi. At the same time, the driver DODT2 is a CMOS inverter configured from a p type MOS transistor MP3 and an n type MOS transistor MN3, and has its input terminal supplied with an activating signal ODTENib. As mentioned later, the signals ODTENi and ODTENib (i=0~7) have timings of rise that differ, whereby a plurality of on-die termination circuits ODT are activated at different timings. Note that the resistance R1 and R2 may be omitted in the on-die termination circuit ODT. That is, the pull-up element in the on-die termination circuit ODT may include the p type MOS transistor MP1 only, and the pull-down element in the on-die termination circuit ODT may include the n type MOS transistor MN1 only.

Moreover, an off-chip driver circuit OCD is also connected to the pad PAD. The off-chip driver circuit OCD is provided to perform matching of an input resistance and an output resistance when data is outputted from the memory chip 100 toward the memory controller 200. The off-chip driver circuit OCD comprises a p type MOS transistor MP4 and an n type MOS transistor MN4 connected in series between a power supply terminal and a ground terminal. Gates of the p type MOS transistor MP4 and the n type MOS transistor MN4 are respectively controlled by drivers not illustrated.

In a standby state when there is no data input from the memory controller 200, these on-die termination circuits ODT are set to a resting state, thereby achieving a reduction in power consumption. On the other hand, in an active state when data is inputted from the memory controller 200, the on-die termination circuit ODT is activated. However, in the active state, when these plurality of on-die termination circuits ODT are activated all at once, problems occur such as a power supply voltage becoming unstable, a peak current increasing causing a load borne by a power supply circuit to increase, and so on.

Figure 4:
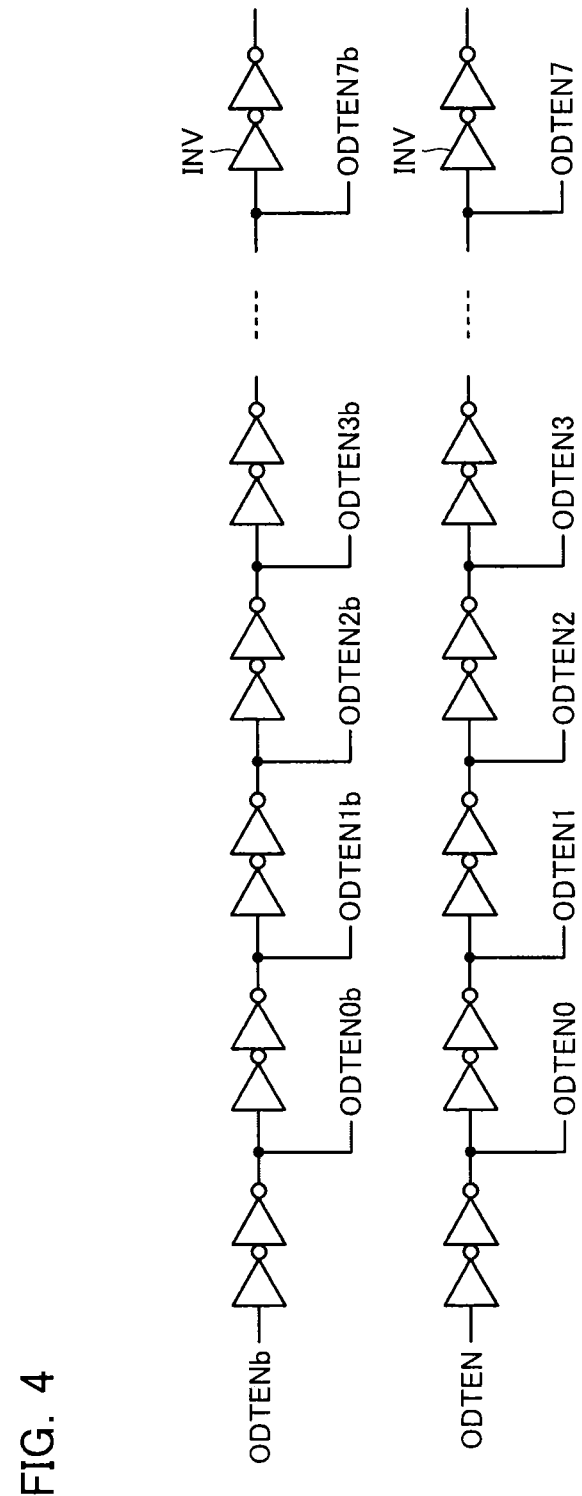
FIG. 4 shows a configuration of an inverter chain circuit in a control circuit 7.

Accordingly, the present embodiment comprises a configuration where a plurality of the on-die termination circuits ODT are activated sequentially. Specifically, the control circuit 7 of FIG. 1 generates the above-mentioned activating signals ODTENi and ODTENib (i=0~7) via an inverter chain circuit such as shown in FIG. 4. The inverter chain circuit of FIG. 4 comprises a plurality of inverter circuits INV connected in series in two columns. The leading two inverter circuits INV have their input terminals inputted with activating signals ODTEN and ODTENb, respectively. The above-mentioned activating signals ODTENi and ODTENib are outputted via a different number of inverter circuits INV, hence rise timings each differ. Such activating signals ODTENi and ODTENib are inputted to the respective driver circuits DODT1 and DODT2 connected to the on-die termination circuit ODT. As a result, the plurality of on-die termination circuits ODT are activated sequentially each at a different timing. This makes it possible to prevent the plurality of on-die termination circuits ODT being activated all at once.

Note that the on-die termination circuit ODT shown in FIG. 3 is configured by series connection of a resistor and a transistor, but may also be configured by a transistor only. Moreover, the off-chip driver circuit OCD is configured by a transistor only in FIG. 3, but may also be configured by series connection of a resistor and a transistor, similarly to the on-die termination circuit ODT of FIG. 3.

Furthermore, the activating signals ODTENi and ODTENib inputted to one on-die termination circuit ODT may be changed at the same timing or may be changed at different timings. In the case where the activating signals ODTENi and ODTENib change at different timings, the driver circuits DODT1 and DODT2 are activated at different timings.

[Second Embodiment]

Figure 5:
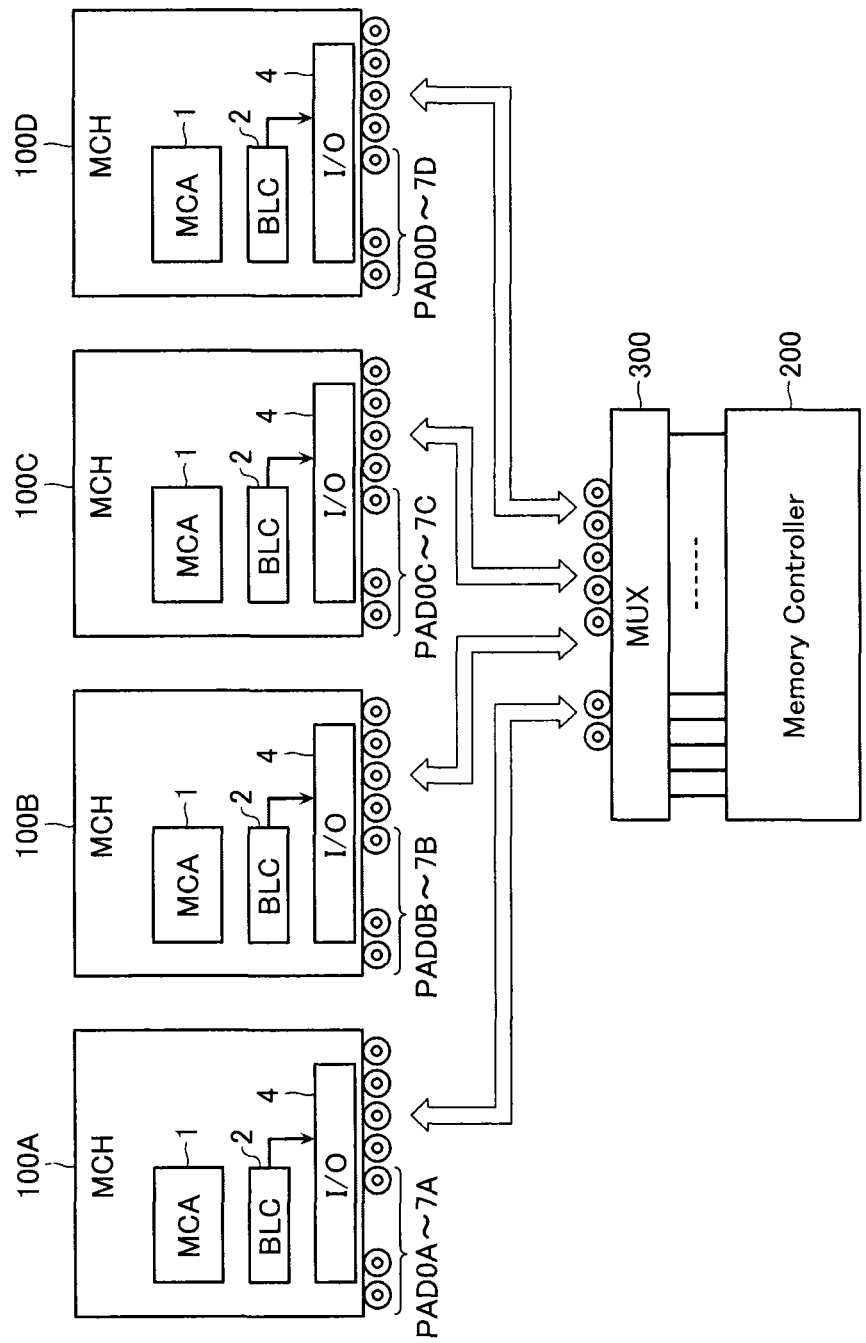
FIG. 5 is a block diagram showing a configuration of a nonvolatile semiconductor memory device according to a second embodiment.

Next, a nonvolatile semiconductor memory device according to a second embodiment will be described with reference to FIG. 5. The nonvolatile semiconductor memory device of this embodiment comprises the memory chip 100 and the memory controller 200, similarly to the first embodiment. An internal structure of the memory chip 100 is similar to that of the first embodiment (however, to simplify the drawing in FIG. 5, illustration of several configurative elements is omitted).

However, this second embodiment differs from the first embodiment in having one memory controller 200 controlling a plurality of (in FIG. 5, four) memory chips 100A~100D. The memory controller 200 is selectively connected to the memory chips 100A~100D by control of a multiplexer 300.

Figure 6:
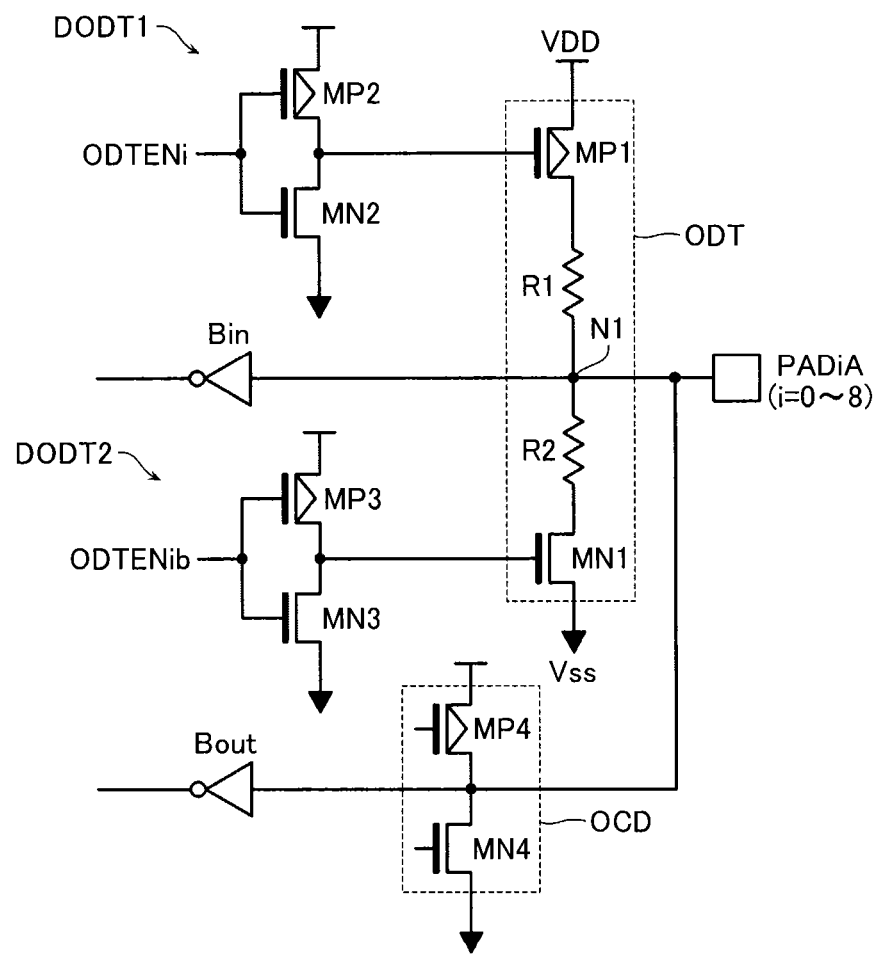
FIG. 6 explains a specific example of configuration of a termination circuit 9.
Figure 7:
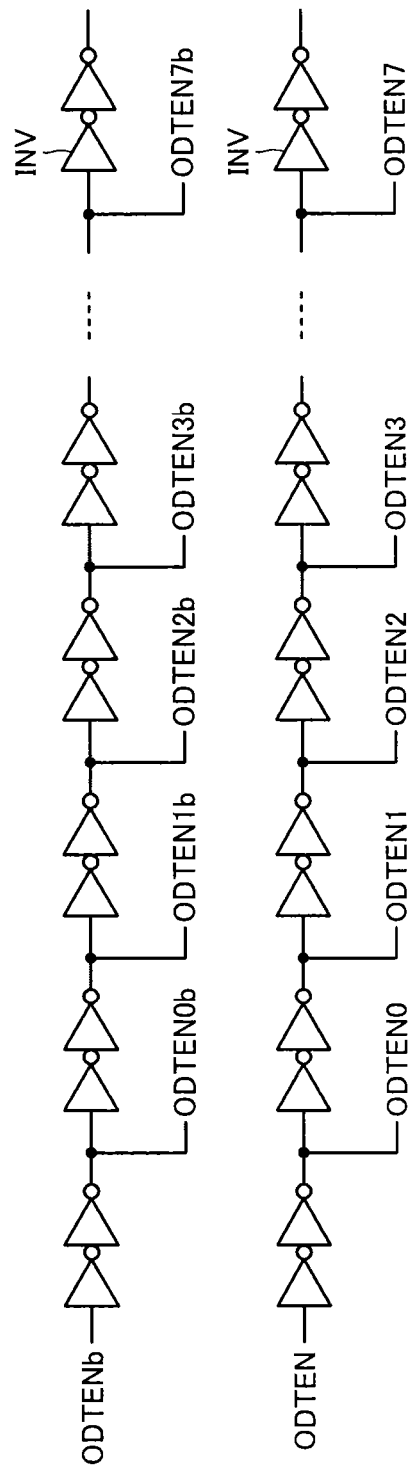
FIG. 7 shows a configuration of an inverter chain circuit in a control circuit 7.

The memory chips 100A~100D respectively comprise pads PAD0A~PAD7A, PAD0B~PAD7B, PAD0C~PAD7C, and PAD0D~PAD7D that are for inputting eight bits of data. Moreover, as shown in FIG. 6, each of the pads PAD0A~PAD7A has an on-die termination circuit ODT similar to that of the first embodiment connected thereto. Such on-die termination circuits ODT are activated sequentially in the same manner as in the first embodiment by an inverter chain circuit such as shown in FIG. 7. This allows similar advantages to those of the first embodiment to be obtained.

[Third Embodiment]

Next, a nonvolatile semiconductor memory device according to a third embodiment will be described with reference to FIG. 8. An overall configuration of the nonvolatile semiconductor memory device in this third embodiment is substantially identical to that in the first embodiment (FIG. 1). However, in this third embodiment, configurations of the drivers DODT1 and DODT2 are different to those of the first embodiment. Note that configurative elements in FIG. 8 identical to those in FIG. 3 are assigned with identical symbols to those assigned in FIG. 3, and a detailed description of such configurative elements is omitted below.

This third embodiment, in addition to being configured capable of controlling rise timing of a plurality of the on-die termination circuits ODT, is also configured capable of controlling a through-rate of an output signal of the on-die termination circuit ODT. That is, the driver DODT1 in the third embodiment is configured having p type MOS transistors MP2 and MP4 and n type MOS transistors MN4 and MN2 connected in series. The driver DODT2 in the third embodiment is configured having p type MOS transistors MP3 and MP5 and n type MOS transistors MN5 and MN3 connected in series.

Gates of the transistors MP4 and MN4 are inputted with signals IREFPi and IREFNi (i=0~7). Moreover, gates of the transistors MP5 and MN5 are also inputted with the signals IREFPi and IREFNi. This signal IREFPi is a signal that, when the on-die termination circuit ODT is activated, falls from "H" toward "L" with a controlled inclination (through-rate). Conversely, the signal IREFNi is a signal that, when the on-die termination circuit ODT is activated, rises from "L" toward "H" with a controlled inclination (through-rate). In other words, the signals IREFPi and IREFNi are configured having their through-rates changeable.

Controlling the inclination of the signals IREFPi and IREFNi in this way enables the on-die termination circuits ODT of the pads PAD0~PAD7 to have through-rates of their output signals changed. Note that the inclinations of the signals IREFPi and IREFNi can each be independently controlled using an RC circuit, or the like, not illustrated. Conversely, the signals IREFPi and IREFNi (i=0~7) may also be controlled to all have an identical inclination.

Figure 8:
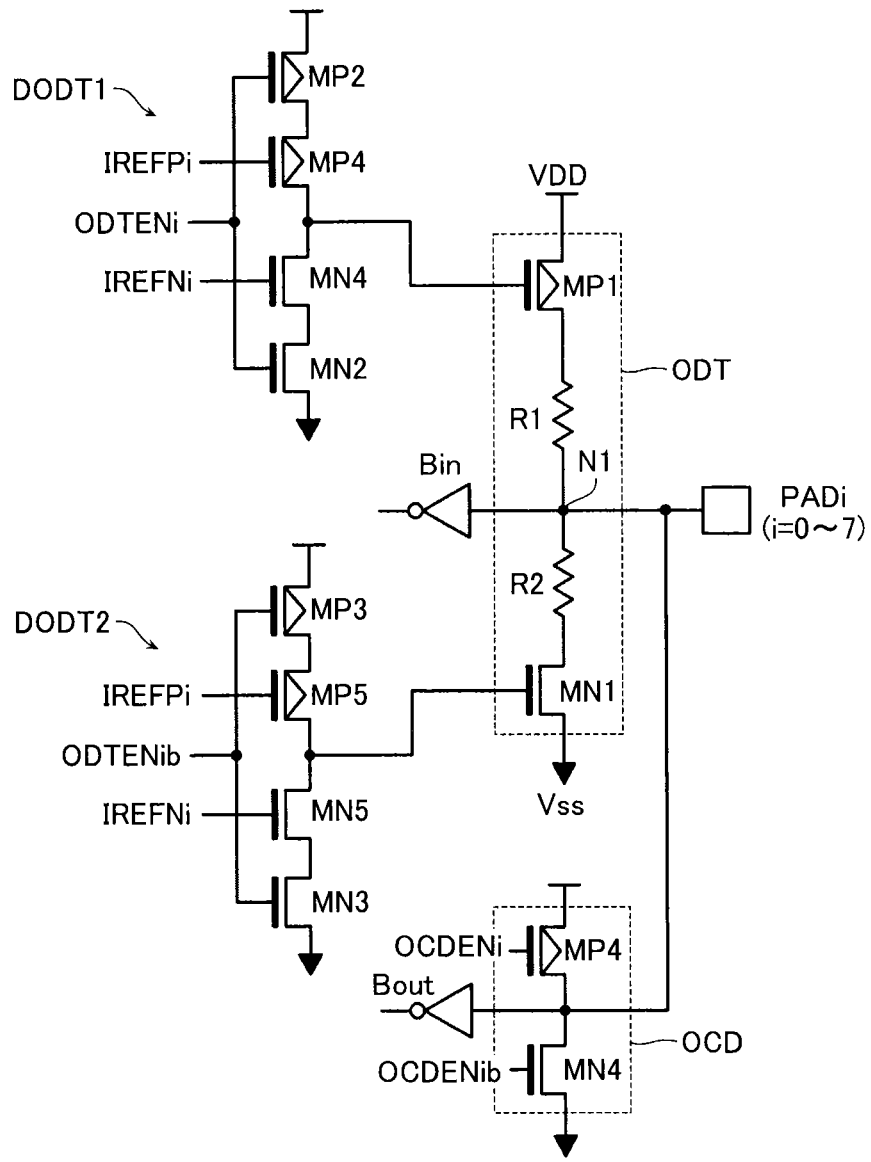
FIG. 8 explains a specific example of configuration of a termination circuit 9.

Conversely, in this circuit of FIG. 8, the inclination of the signals IREFPi and IREFNi may be independently controlled, while setting the rise timing of the signals ODTENi and ODTENib (i=0~7) all identical. This also allows rise timing of the on-die termination circuit ODT to be controlled.

Furthermore, rise timing of the signals ODTENi and ODTENib and rise timing of the signals IREFPi and IREFNi may be identical or may be different.

[Fourth Embodiment]

Figure 9:
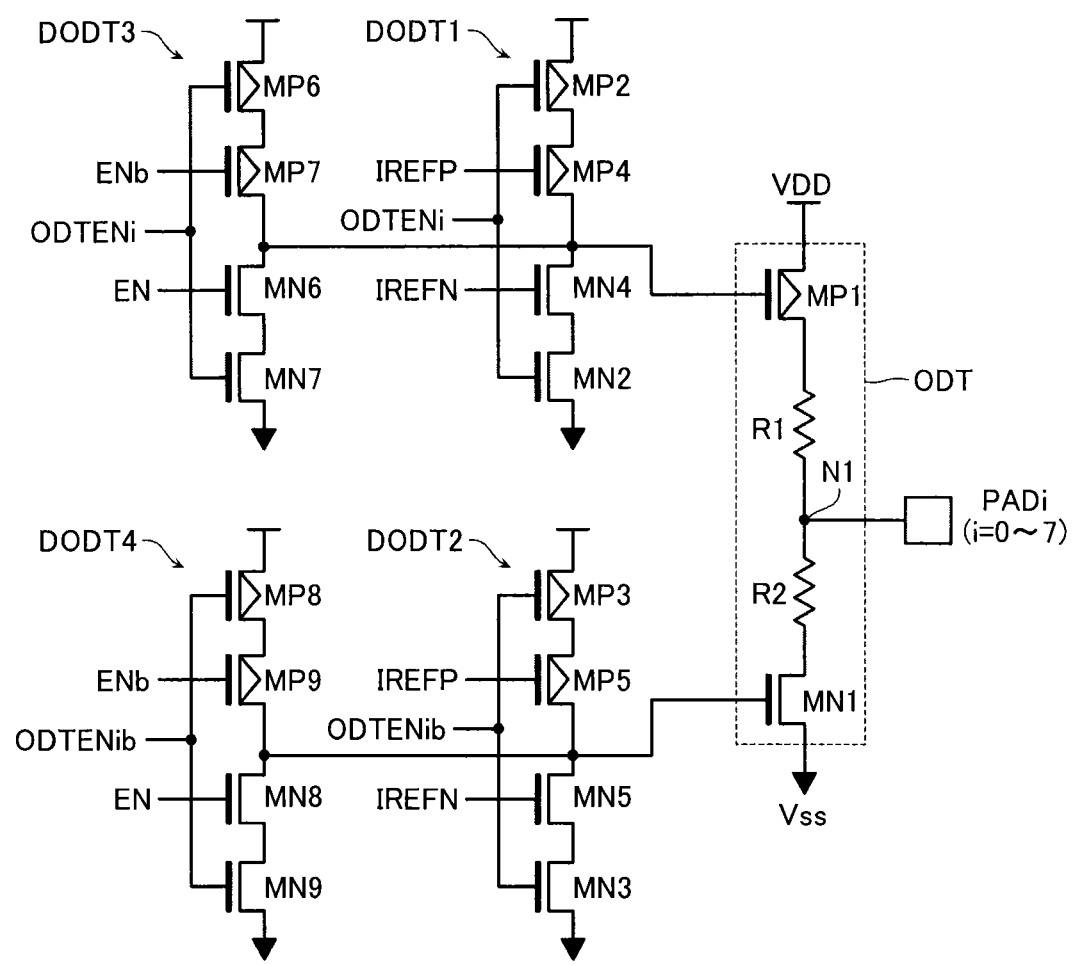
FIG. 9 explains a specific example of configuration of a termination circuit 9.

Next, a nonvolatile semiconductor memory device according to a fourth embodiment will be described with reference to FIG. 9. An overall configuration of the nonvolatile semiconductor memory device in this fourth embodiment is substantially identical to that in the first embodiment (FIG. 1). However, this fourth embodiment comprises drivers DODT3 and DODT4 in addition to the drivers DODT1 and DODT2, as drivers for controlling the on-die termination circuit ODT. Note that configurative elements in FIG. 9 identical to those in FIG. 8 are assigned with identical symbols to those assigned in FIG. 8, and a detailed description of such configurative elements is omitted below.

The driver DODT3 is configured having p type MOS transistors MP6 and MP7 and n type MOS transistors MN6 and MN7 connected in series. The transistor MP1 is driven by an output signal of the driver DODT3. The transistors MP6 and MN7 are inputted with the activating signal ODTENi similarly to the driver DODT1. On the other hand, the transistors MP7 and MN6 are inputted with enable signals ENb and EN, respectively. The enable signal EN is a signal that at a timing when a corresponding on-die termination circuit ODT is activated, rises from "L" to "H" with a high through-rate. On the other hand, the enable signal ENb is an inverted signal of the enable signal EN.

The driver DODT4 is configured having p type MOS transistors MP8 and MP9 and n type MOS transistors MN8 and MN9 connected in series. The transistor MP2 is driven by an output signal of the driver DODT4. The transistors MP8 and MN9 are inputted with the activating signal ODTENib similarly to the driver DODT2. On the other hand, the transistors MP9 and MN8 are inputted with the enable signals ENb and EN, respectively.

As described above, this embodiment comprises the drivers DODT1 and DODT2 that drive the on-die termination circuit ODT according to the controlled signals IREFPi and IREFNi, and also provides the drivers DODT3 and DODT4 that drive the on-die termination circuit ODT according to the enable signals EN and ENb having a fixed high through-rate. When the drivers DODT1 and DODT2 are employed, then, as well as the plurality of on-die termination circuits ODT being activated at different timings, the through-rate of the output signal of the individual on-die termination circuits ODT can also be controlled. On the other hand, when the drivers DODT3 and DODT4 are employed, then the plurality of on-die termination circuits ODT can be activated at different timings, and the individual on-die termination circuits ODT can be activated speedily by the high fixed enable signals EN and ENb. In such a way, the present embodiment allows operation of the on-die termination circuits ODT to be different between in the case where the drivers DODT1 and DODT2 are used and the case where the drivers DODT3 and DODT4 are used.

[Fifth Embodiment]

Figure 10:
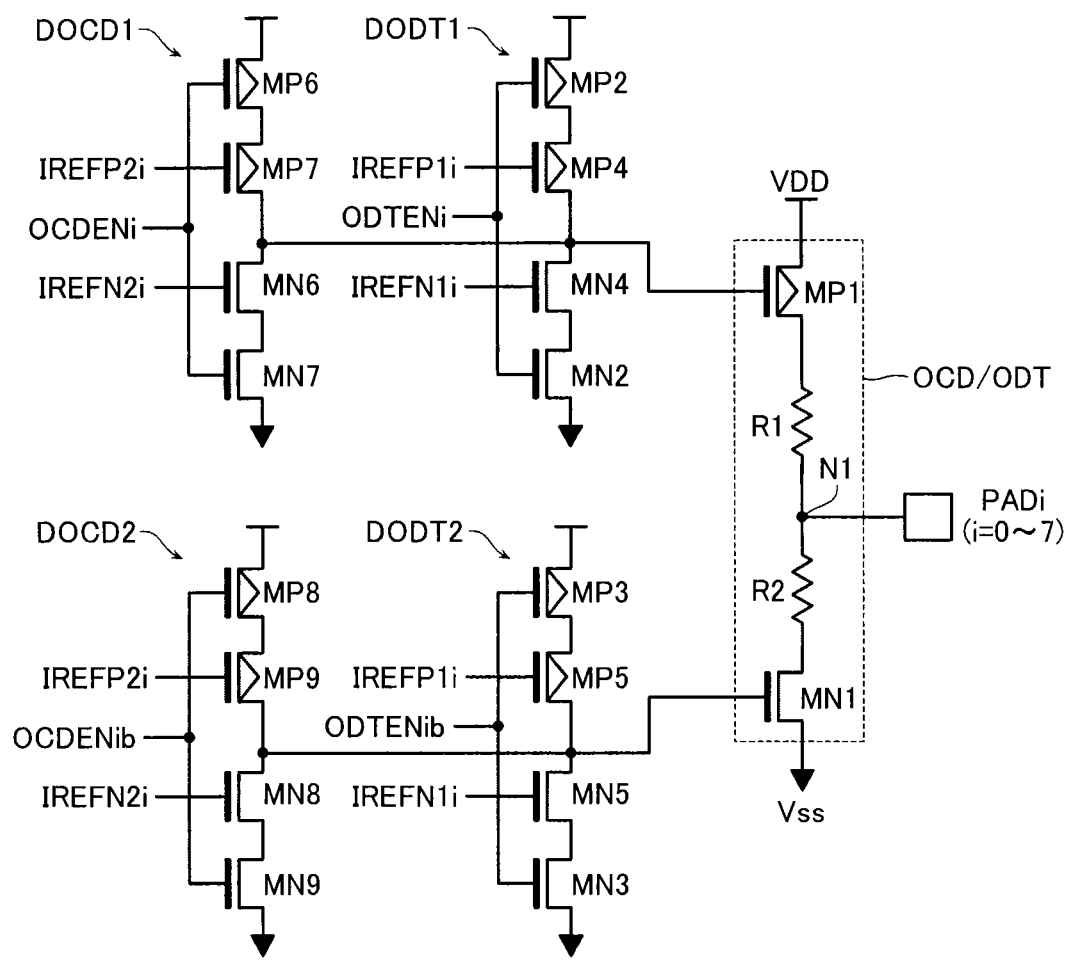
FIG. 10 explains a specific example of configuration of a termination circuit 9.

Next, a nonvolatile semiconductor memory device according to a fifth embodiment will be described with reference to FIG. 10. An overall configuration of the nonvolatile semiconductor memory device in this fifth embodiment is substantially identical to that in the first embodiment (FIG. 1). However, this fifth embodiment differs from the previously described embodiments in that the on-die termination circuit ODT of the fifth embodiment also functions as the off-chip driver circuit OCD. Below, a circuit that functions both as the on-die termination circuit and the off-chip driver circuit is referred to as a "dual-purpose circuit OCD/ODT".

This embodiment comprises the drivers DODT1 and DODT2 as drivers for causing the dual-purpose circuit OCD/ODT to function as the on-die termination circuit ODT. A configuration of these drivers DODT1 and DODT2 is substantially identical to that in the previously described embodiments.

In addition, this embodiment comprises drivers DOCD1 and DOCD2 as drivers for causing the dual-purpose circuit OCD/ODT to function as the off-chip driver circuit OCD.

The driver DOCD1 is configured having transistors MP6 and MP7 and transistors MN6 and MN7 connected in series. Gates of the transistors MP6 and MN7 are inputted with a signal OCDENi. Moreover, gates of the transistors MP7 and MN6 are inputted with signals IREFP2$i$ and IREFN2$i$. These signals IREFP2$i$ and IREFN2$i$ are signals having a controlled through-rate, similarly to the signals IREFP1$i$ and IREFN1$i$ inputted to the driver DODT1, and are separate signals to the signals IREFP1$i$ and IREFN1$i$. The signals IREFP2$i$ and IREFN2$i$ ($i$=0~7) may each have their through-rate changed independently, or may all be provided with an identical through-rate.

In addition, the driver DOCD2 is configured having transistors MP8 and MP9 and transistors MN8 and MN9 connected in series. Gates of the transistors MP8 and MN9 are inputted with a signal OCDENib. Moreover, gates of the transistors MP9 and MN8 are inputted with the signals IREFP2$i$ and IREFN2$i$.

The signals OCDENi, OCDENib, IREFP2, and IREFN2 are set to optimal voltage values for causing the dual-purpose circuit OCD/ODT to operate as the off-chip driver circuit OCD.

Figure 11:
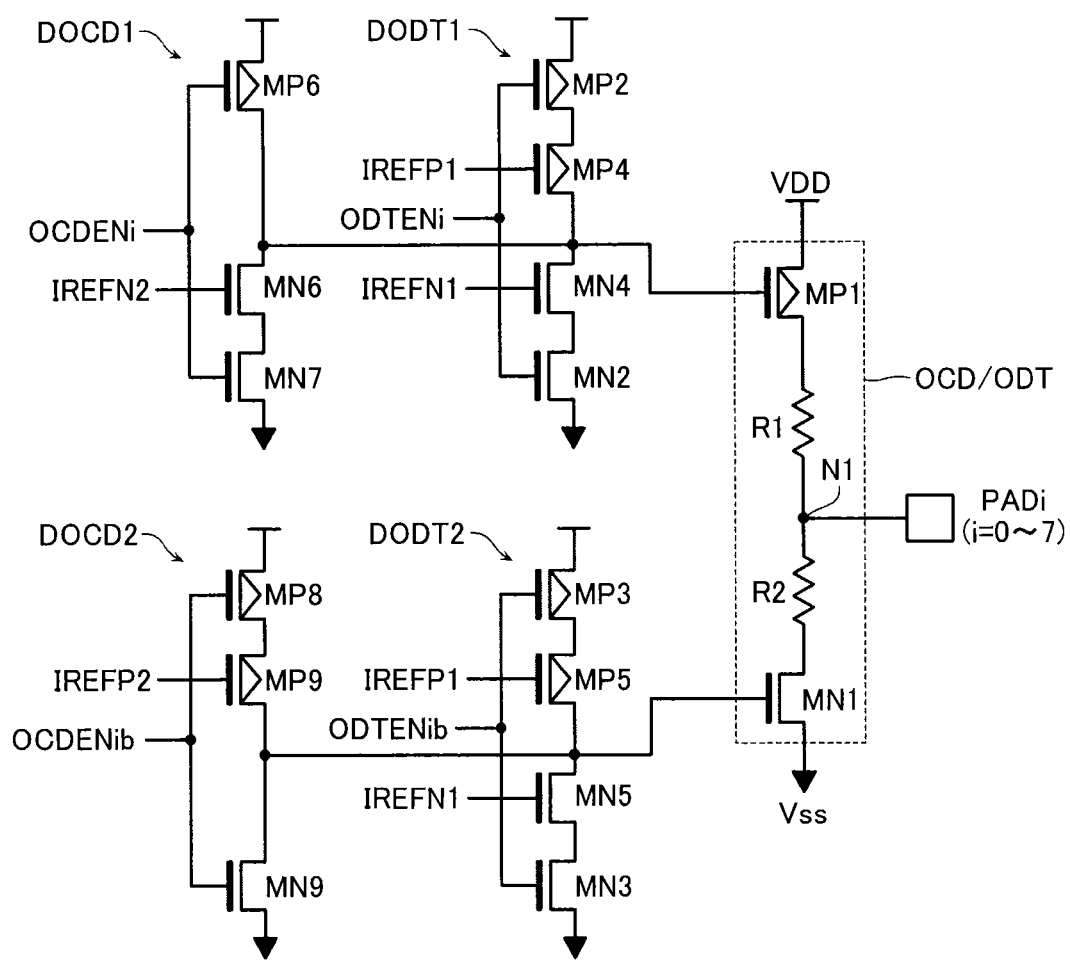
FIG. 11 explains a specific example of configuration of a termination circuit 9.
Figure 12:
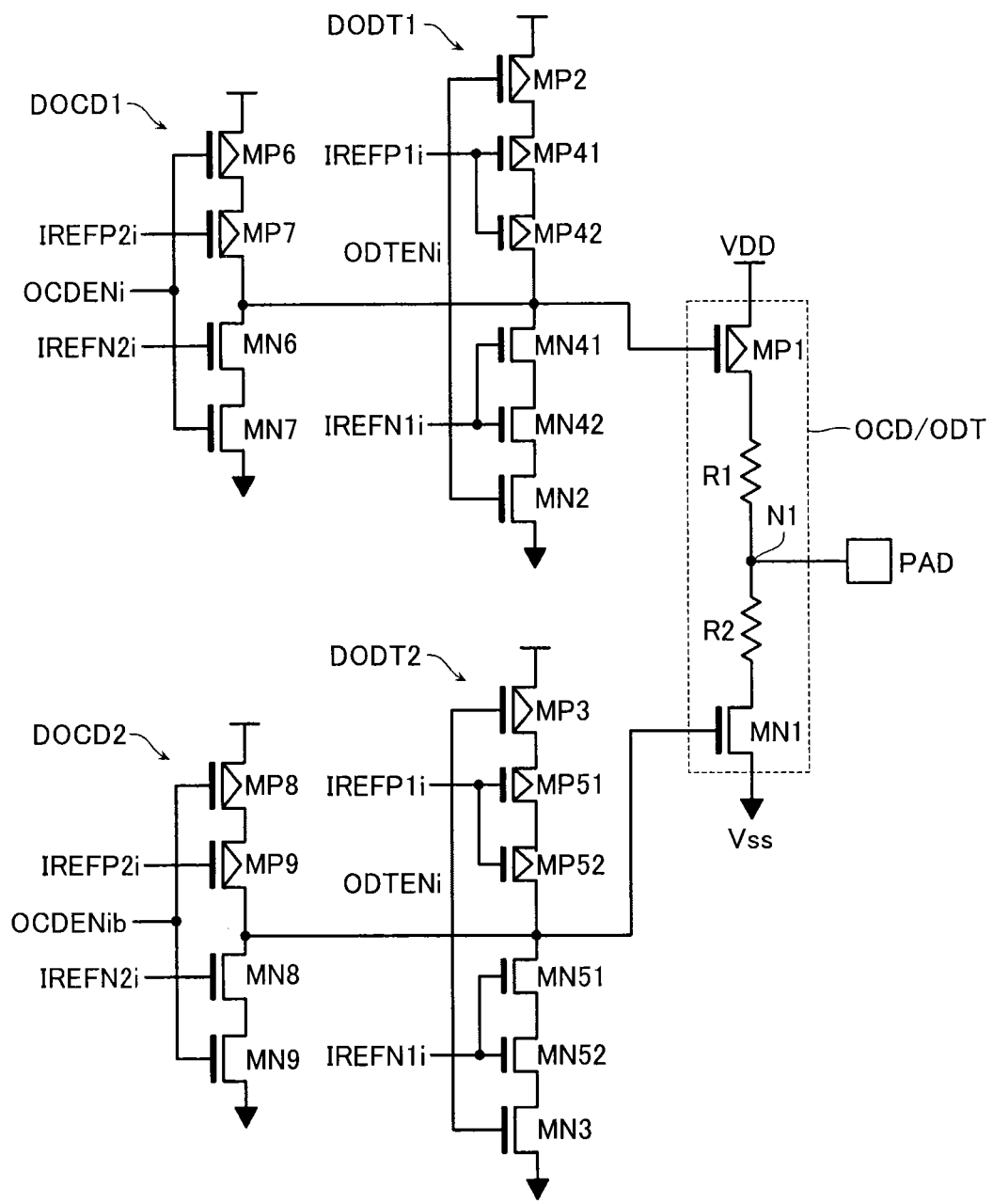
FIG. 12 explains a specific example of configuration of a termination circuit 9.

FIG. 11 is a first modified example of this fifth embodiment. In this FIG. 11, the transistor MP7 is omitted in the driver DOCD1, and the transistor MN8 is omitted in the driver DOCD2. This circuit too allows a similar action to that of the fifth embodiment to be displayed. FIG. 12 is a second modified example of this fifth embodiment. In this FIG. 12, the transistor MP4 is replaced with two transistors MP41 and MP42 of small size. In addition, the transistor MN4 is replaced with two transistors MN41 and MN42 of small size. The transistor MP5 is replaced with two transistors MP51 and MP52 of small size. In addition, the transistor MN5 is replaced with two transistors MN51 and MN52 of small size.

[Sixth Embodiment]

Next, a nonvolatile semiconductor memory device according to a sixth embodiment will be described with reference to FIG. 13A. An overall configuration of the nonvolatile semiconductor memory device in this sixth embodiment is substantially identical to that in the first embodiment (FIG. 1).

Figure 13A:
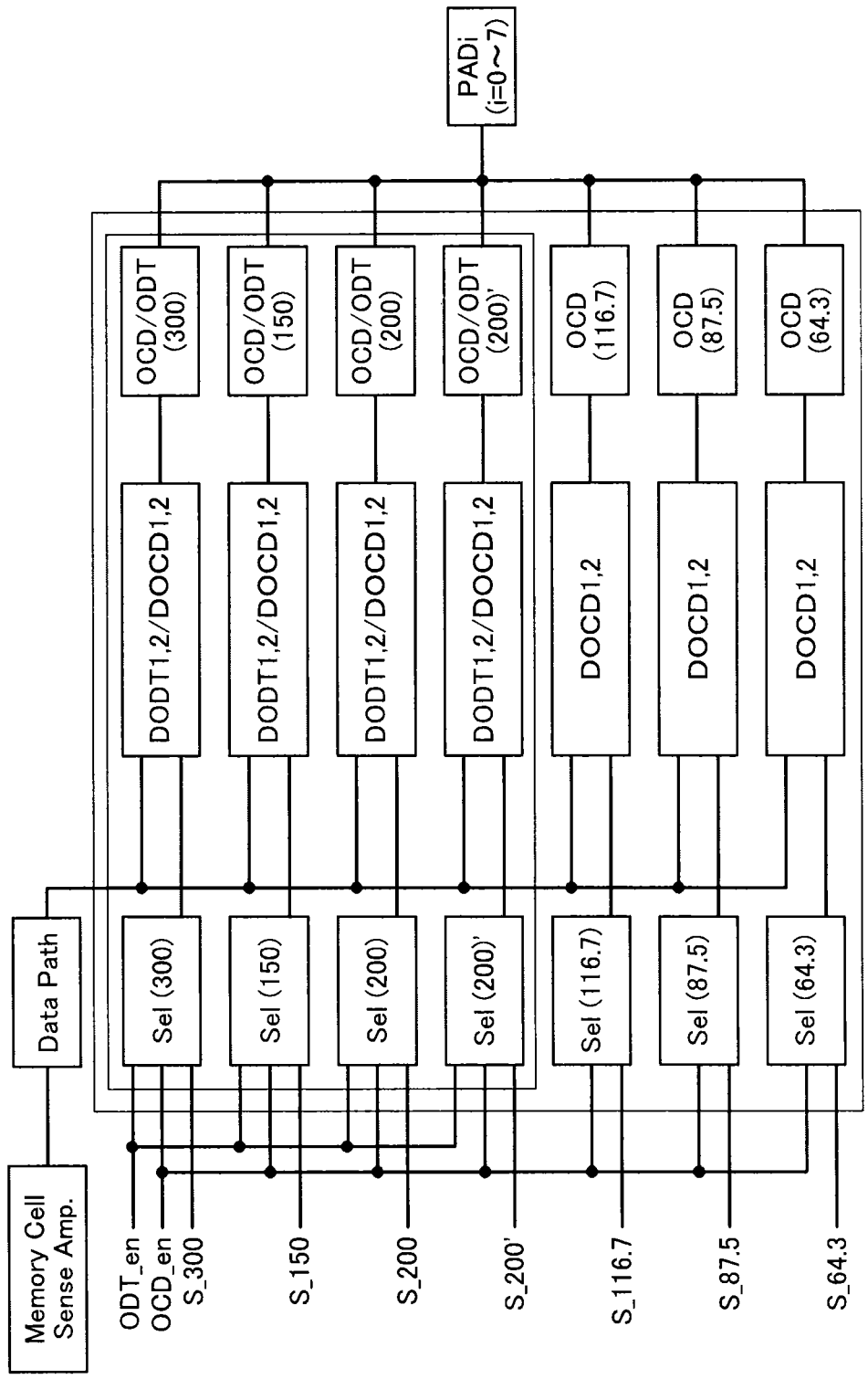
FIG. 13A is a block diagram showing a configuration of a nonvolatile semiconductor memory device according to a sixth embodiment.

However, as shown in FIG. 13A, this sixth embodiment differs from the previously described embodiments in that connected to one pad PADi of the sixth embodiment are a plurality of the off-chip driver circuits OCD and the dual-purpose circuits OCD/ODT. In FIG. 13, numbers in the blocks of the circuits OCD and dual-purpose circuits OCD/ODT (300, 150, 200, 116.7, 87.5, and 64.3) indicate a termination resistance provided by each circuit. That is, in the example of FIG. 13, connected to one pad PADi are four dual-purpose circuits OCD/ODT and three off-chip driver circuits OCD. The four circuits OCD/ODT have termination resistances of 300 52, 150Ω, 200Ω, and 200Ω, respectively. Moreover, the three off-chip driver circuits OCD have termination resistances of 116.7Ω, 87.5Ω, and 64.3Ω, respectively. These resistance values comply with for example ONFi/Toggle standards. The off-chip driver circuits OCD and dual-purpose circuits OCD/ODT are indicated as a block diagram in FIG. 13, but both may have circuit configurations similar to those of the previously described embodiments.

Provided as circuits for selectively activating the plurality of off-chip driver circuits OCD and dual-purpose circuits OCD/ODT connected to one pad PADi in the above-described manner are drivers DOCD1, DOCD2, DODT1, and DODT2. The drivers DOCD1 and DOCD2, and DODT1 and DODT2 are also indicated as a block diagram in FIG. 13, but they too may have detailed circuit configurations similar to those of the previously described embodiments. A selection circuit Sel is provided as a selection circuit for selectively driving these drivers DOCD and DODT.

The selection circuit Sel in this example comprises selection circuits Sel(300), Sel(150), Sel(200), Sel(200)', Sel(116.7), Sel(87.5), and Sel(64.3). The selection circuits Sel (300), Sel(150), Sel(200), Sel(200)', Sel(116.7), Sel(87.5), and Sel(64.3) are provided corresponding to dual-purpose circuits OCD/ODT(300), OCD/ODT(150), OCD/ODT(200), and OCD/ODT(200)', and circuits OCD(116.7), OCD(87.5), and OCD(64.3), respectively. Activating any combination of off-chip driver circuits OCD and dual-purpose circuits OCD/ODT by such a selection circuit Sel enables the termination resistance of the pad PADi to be set to various different values. The selection circuit Sel is activated when signals S_300, S_150, S_200, S_200', S_116.7, S_87.5, and S_64.3 inputted from external become "H", thereby operating the corresponding circuits OCD or dual-purpose circuits OCD/ODT. Moreover, the selection circuit Sel is inputted with signals ODT_en or OCD_en. When the signal ODT_en becomes "H", the selection circuit Sel drives the corresponding drivers DODT1 and DODT2 to operate the dual-purpose circuit OCD/ODT as an on-die termination circuit. Moreover, when the signal OCD_en becomes "H", the selection circuit Sel drives the corresponding drivers DOCD1 and DOCD2 to operate the dual-purpose circuit OCD/ODT as an off-chip driver circuit, and operates the circuit OCD.

In order to provide a termination resistance of various values to the pad PADi, the dual-purpose circuits OCD/ODT and the circuits OCD shift to an operation state separately or simultaneously. FIG. 13B is a correspondence table showing a relationship between a combination of circuits simultaneously selected and a value of the termination resistance thus obtained. The "x" mark indicates a circuit being subject to operation. As shown in FIG. 13B, when for example circuits OCD/ODT (300) and OCD/ODT (150) shift to an operation state simultaneously, a composite termination resistance supplied is 100Ω. In addition, operating other pluralities of dual-purpose circuits OCD/ODT and/or circuits OCD besides these simultaneously in a similar manner makes it possible to provide an OCD or ODT having various termination resistances.

As described above, the present embodiment allows identical advantages to those of the previously described embodiments to be obtained, and, moreover, is configured capable of having the termination resistance of each of the pads PAD switched to various values. Note that this embodiment too allows the likes of operation timing and through-rate of output signals of the dual-purpose circuits OCD/ODT and/or circuits OCD to be controlled similarly to in the previously described embodiments.

[Seventh Embodiment]

Next, a nonvolatile semiconductor memory device according to a seventh embodiment will be described with reference to FIG. 14A. An overall configuration of the nonvolatile semiconductor memory device in this seventh embodiment is substantially identical to that in the first embodiment (FIG. 1).

Figure 14A:
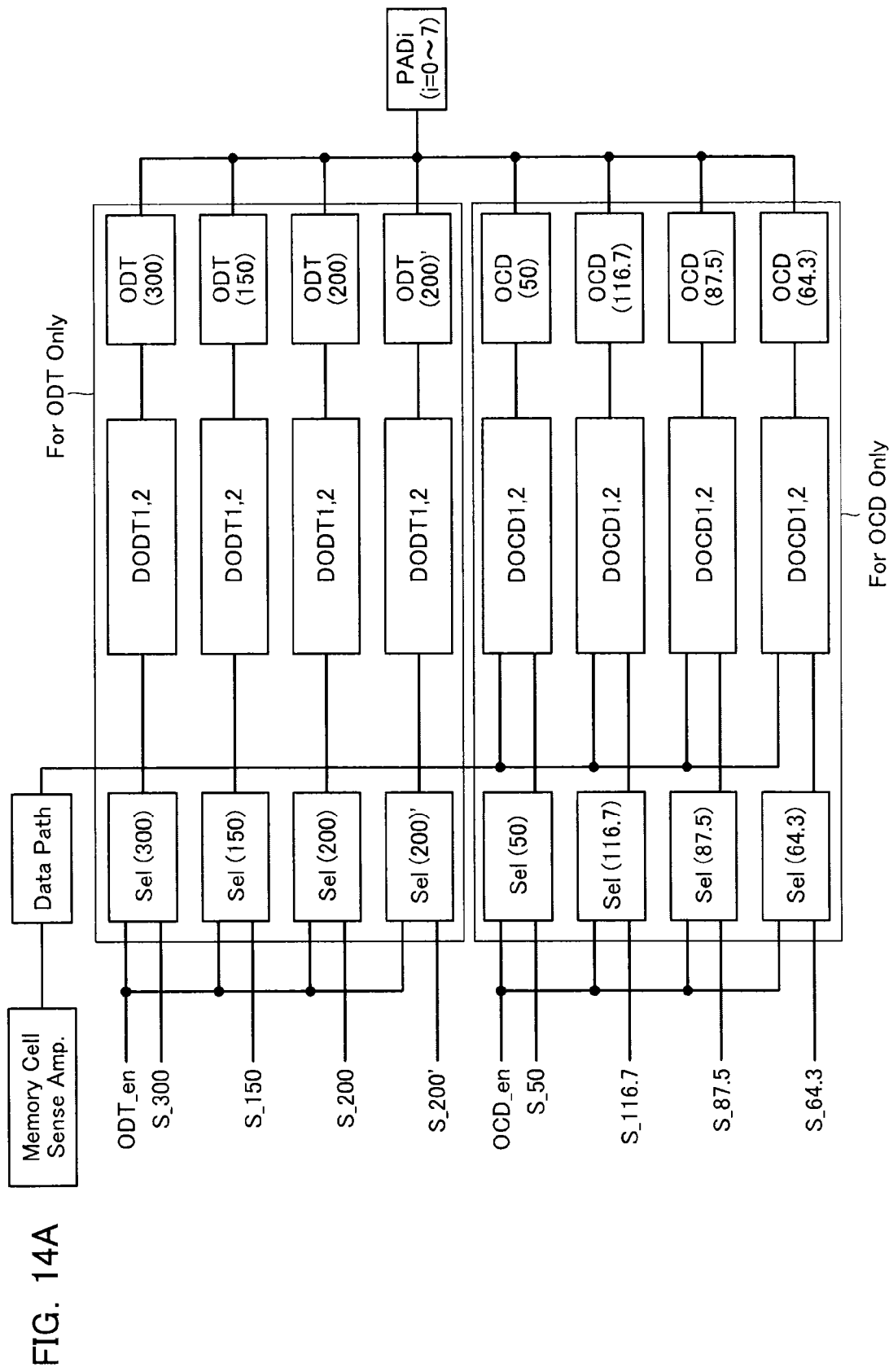
FIG. 14A is a block diagram showing a configuration of a nonvolatile semiconductor memory device according to a seventh embodiment.

However, as shown in FIG. 14A, this seventh embodiment differs from the previously described embodiments in that connected to one pad PADi of the seventh embodiment are a plurality of the off-chip driver circuits OCD and a plurality of the on-die termination circuits ODT. In the sixth embodiment, dual-purpose circuits OCD/ODT are connected, but in this seventh embodiment, only an exclusive off-chip driver circuit (OCD) and an exclusive on-die termination circuit (ODT) are connected. In other words, the circuit OCD functions only as an off-chip driver circuit, and the circuit ODT functions only as an on-die termination circuit. As a result, the selection circuits Sel(300), Sel(150), Sel (200), and Sel(200)' are each inputted only with the signal ODT_en. Moreover, the selection circuits Sel(50), Sel(116.7), Sel(87.5), and Sel (64.3) are inputted only with the signal OCD_en. FIG. 14B is a correspondence table showing a relationship between a combination of circuits simultaneously selected and a value of the termination resistance thus obtained. The "x" mark indicates a circuit being subject to operation.

As described above, the present embodiment allows identical advantages to those of the previously described embodiments to be obtained, and, moreover, is configured capable of having the termination resistance of each of the pads PAD switched to various values. Note that this embodiment too allows the likes of operation timing and through-rate of output signals of the dual-purpose circuits OCD/ODT and/or circuits OCD to be controlled similarly to in the previously described embodiments.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory device configured having memory cells arranged therein;
   a data output buffer for outputting data read from the memory device, and a data input buffer for receiving data to be written to the memory device;
   a plurality of input/output pads to which the data input buffer and the data output buffer for inputting/outputting the data are respectively connected;
   a plurality of on-die termination circuits each connected to any one of the plurality of input/output pads; and
   a control circuit operative to control the on-die termination circuits,
   the plurality of on-die termination circuits each comprising:
   a pull-up element connected between a first terminal and an output terminal; and
   a pull-down element connected between the output terminal and a second terminal,
   the pull-up element being driven by a first pull-up element driver,
   the pull-down element being driven by a first pull-down element driver, and
   the control circuit being operative to activate a plurality of the on-die termination circuits at different timings,
   wherein at least a portion of the plurality of on-die termination circuits function also as an off-chip driver circuit for when outputting data from the memory cell array to external,
   and further comprising:
   a second pull-up element driver for driving the pull-up element when the on-die termination circuit is caused to function as the off-chip driver circuit; and
   a second pull-down element driver for driving the pull-down element when the on-die termination circuit is caused to function as the off-chip driver circuit.

2. The semiconductor memory device according to claim 1, wherein
   the control circuit is configured to transmit to the first pull-up element driver and the first pull-down element driver a first activating signal which is for activating the plurality of the on-die termination circuits at different timings.

3. The semiconductor memory device according to claim 1, wherein
   the control circuit is configured to transmit to the first pull-up element driver and the first pull-down element driver a second activating signal which is configured through-rate changeable.

4. The semiconductor memory device according to claim 1, wherein
   the control circuit is configured to
   transmit to the first pull-up element driver and the first pull-down element driver a first activating signal which is for activating the plurality of the on-die termination circuits at different timings, and
   transmit to the first pull-up element driver and the first pull-down element driver a second activating signal which is configured through-rate changeable.

5. The semiconductor memory device according to claim 4, wherein
   the first pull-up element driver and the first pull-down element driver are configured having a first p type MOS transistor, a first n type MOS transistor, and a first transistor connected in series therein,
   gates of the first p type MOS transistor and the first n type MOS transistor are inputted with the first activating signal, and
   a gate of the first transistor is inputted with the second activating signal.

6. The semiconductor memory device according to claim 1, wherein
 a plurality of the on-die termination circuits are connected to a single one of the input/output pads, and
 the control circuit is configured to selectively drive at least one or multiple ones of a plurality of the on-die termination circuits to provide a different termination resistance to the input/output pad.

7. The semiconductor memory device according to claim 1, wherein
 the second pull-up element driver and the second pull-down element driver are configured having a second p type MOS transistor, a second n type MOS transistor, and a second transistor connected in series therein,
 gates of the second p type MOS transistor and the second n type MOS transistor are inputted with the third activating signal, and
 a gate of the second transistor is inputted with the fourth activating signal.

8. The semiconductor memory device according to claim 1, wherein
 a plurality of the on-die termination circuits are connected to a single one of the input/output pads, and
 the control circuit is configured to selectively drive at least one or multiple ones of a plurality of the on-die termination circuits to provide a different termination resistance to the input/output pad.

9. The semiconductor memory device according to claim 1, wherein
 the first pull-up element driver and the first pull-down element driver are activated at timings that differ from each other.

10. The semiconductor memory device according to claim 1, wherein
 the pull-up element includes a third transistor and a first resistance connected in series, and
 the pull-down element includes a fourth transistor and a second resistance connected in series.

11. A semiconductor memory device, comprising:
 a memory device configured having memory cells arranged therein;
 a data output buffer for outputting data read from the memory device, and a data input buffer for receiving data to be written to the memory device;
 a plurality of input/output pads to which the data input buffer and the data output buffer for inputting/outputting the data are respectively connected;
 a plurality of on-die termination circuits and a plurality of off-chip driver circuits each connected to any one of the plurality of input/output pads; and
 a control circuit operative to control the on-die termination circuit and the off-chip driver circuit,
 the control circuit being configured to selectively drive at least one or multiple ones of the on-die termination circuits or the off-chip driver circuits to provide a different termination resistance to the input/output pad.

12. The semiconductor memory device according to claim 11, wherein
 a plurality of the on-die termination circuits connected to a single one of the plurality of input/output pads have different resistance values.

13. The semiconductor memory device according to claim 11, wherein
 a plurality of the off-chip driver circuits connected to a single one of the plurality of input/output pads have different resistance values.

14. The semiconductor memory device according to claim 11, wherein
 a plurality of the on-die termination circuits connected to a single one of the plurality of input/output pads have different resistance values, and
 a plurality of the off-chip driver circuits connected to a single one of the plurality of input/output pads have different resistance values.

15. The semiconductor memory device according to claim 11, wherein
 at least one of the on-die termination circuits is a dual-purpose circuit that doubles as an off-chip driver circuit.

16. The semiconductor memory device according to claim 15, further comprising a selection circuit operative to select the dual-purpose circuit,
 wherein the selection circuit activates the dual-purpose circuit as an on-die termination circuit or as an off-chip driver circuit in accordance with an enable signal instructing whether to select the dual-purpose circuit as the on-die termination circuit or whether to select the dual-purpose circuit as the off-chip driver circuit.

* * * * *